(12) United States Patent
Petruzzi et al.

(10) Patent No.: US 9,245,888 B2
(45) Date of Patent: Jan. 26, 2016

(54) REVERSE POLARITY PROTECTION FOR N-SUBSTRATE HIGH-SIDE SWITCHES

(71) Applicant: Infineon Technologies AG, Neubiberg (DE)

(72) Inventors: Luca Petruzzi, Goedersdorf (AT); Bernhard Auer, Millstatt (AT); Paolo Del Croce, Villach (AT); Markus Ladurner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 406 days.

(21) Appl. No.: 13/631,924

(22) Filed: Sep. 29, 2012

(65) Prior Publication Data

US 2014/0091384 A1  Apr. 3, 2014

(51) Int. Cl.
| | |
|---|---|
| H01L 29/78 | (2006.01) |
| H01L 27/092 | (2006.01) |
| H01L 27/02 | (2006.01) |
| H03K 17/0814 | (2006.01) |
| H01L 29/423 | (2006.01) |

(52) U.S. Cl.
CPC ........ *H01L 27/0922* (2013.01); *H01L 27/0248* (2013.01); *H01L 29/42368* (2013.01); *H01L 29/7813* (2013.01); *H01L 2924/0002* (2013.01); *H03K 17/08142* (2013.01)

(58) Field of Classification Search
None
See application file for complete search history.

(56) References Cited

U.S. PATENT DOCUMENTS

| | | | | |
|---|---|---|---|---|
| 4,992,683 | A * | 2/1991 | Robin, Jr. | 327/432 |
| 5,539,610 | A * | 7/1996 | Williams et al. | 361/246 |
| 5,629,542 | A * | 5/1997 | Sakamoto et al. | 257/328 |
| 2004/0228053 | A1 * | 11/2004 | Thiery et al. | 361/84 |
| 2006/0126245 | A1 * | 6/2006 | Grose et al. | 361/82 |
| 2008/0224547 | A1 * | 9/2008 | Pastorina et al. | 307/130 |
| 2009/0146628 | A1 | 6/2009 | Nakahara | |
| 2011/0102956 | A1 * | 5/2011 | Nakahara | 361/59 |
| 2012/0169116 | A1 * | 7/2012 | Graf | 307/10.7 |
| 2012/0212870 | A1 * | 8/2012 | Necco | 361/86 |
| 2013/0027114 | A1 * | 1/2013 | Petruzzi et al. | 327/437 |

* cited by examiner

*Primary Examiner* — Jesse Y Miyoshi
*Assistant Examiner* — Abul Kalam
(74) *Attorney, Agent, or Firm* — Slater & Matsil, L.L.P.

(57) ABSTRACT

A semiconductor device is disclosed. In accordance with a first aspect of the present invention the device includes a semiconductor chip having a substrate, a first supply terminal electrically coupled to the substrate to provide a first supply potential ($V_S$) and a load current to the substrate, and a second supply terminal operably provided with a second supply potential. A first vertical transistor is integrated in the semiconductor chip and electrically coupled between the supply terminal and an output terminal. The first vertical transistor is configured to provide a current path for the load current to the output terminal in accordance with a control signal, which is provided to a gate electrode of the first vertical transistor.

14 Claims, 7 Drawing Sheets

REVERSE POLARITY PROTECTION FOR N-SUBSTRATE HIGH-SIDE SWITCHES

TECHNICAL FIELD

The present description relates to circuits providing a reverse polarity protection for semiconductor switches, particularly for a semiconductor device including a plurality of DMOS high side switches integrated in an n-doped substrate.

BACKGROUND

Currently smart power semiconductor switches are used in a broad variety of applications. Not only in automotive applications smart semiconductor switches are increasingly used to replace electro-mechanical relays. Particularly in battery powered systems (e.g., the electronic equipment of a car) a sufficient reverse polarity protection is a requirement. In a typical automotive application the nominal supply voltage is +12 V. A robust electronic device is usually required to withstand a supply voltage up to −16 V (reverse voltage) for at least two minutes.

A multi-channel switching device usually includes one power semiconductor switch (usually a MOSFET) per output channel wherein an electric load is connected to each output channel. Thus each electric load may be switched on and off using the respective semiconductor switch. Assuming an on-resistance of 100 mΩ and a nominal load current of 1 A results in a power loss of 100 mW for each active output channel. Each power semiconductor switch have usually a reverse diode coupled in parallel to the load current path of the semiconductor switch (e.g., the drain-source path in case of a MOSFET). During normal operation this reverse diode is reverse biased and in a blocking state. However, when a negative supply voltage is applied, the reverse diode becomes forward biased and load current may be directed form ground through the load and the reverse diode to the negative supply potential. Assuming a diode forward voltage of at least 0.7 V the resulting power loss in the reverse diode (and thus in the switching device) is 700 mW per output channel, at least seven times more as during normal operation. It goes without saying that such a situation may be hazardous for the switching device and appropriate reverse polarity protection circuitry is required.

Known circuitry providing reverse polarity protection to smart semiconductor switches is comparably complex and requires significant chip space. Thus there is a need for a smart semiconductor switch including an efficient (as far as circuit complexity and chip space requirement are concerned) reverse polarity protection.

SUMMARY OF THE INVENTION

A semiconductor device is disclosed. In accordance with a first aspect of the present invention the device includes a semiconductor chip having a substrate, a first supply terminal electrically coupled to the substrate to provide a first supply potential ($V_S$) and a load current to the substrate, and a second supply terminal operably provided with a second supply potential. A first vertical transistor is integrated in the semiconductor chip and electrically coupled between the supply terminal and an output terminal. The first vertical transistor is configured to provide a current path for the load current to the output terminal in accordance with a control signal, which is provided to a gate electrode of the first vertical transistor.

Furthermore, a control circuitry is integrated in the semiconductor chip and coupled to the first vertical transistor. The control circuitry is configured to generate the control signal to switch the first vertical transistor on and off. The control circuitry comprises a reverse polarity protection circuit.

The reverse polarity protection circuit includes a first MOS transistor coupled in series with a first diode, wherein the MOS transistor and the diode are coupled between the first and the second supply terminals. The reverse polarity protection circuit further includes a first switching circuit that is coupled to the first MOS transistor, electrically connected between the first and the second supply terminals, and configured to activate the MOS transistor when the second supply potential exceeds the first supply potential by more than a given threshold.

BRIEF DESCRIPTION OF THE DRAWINGS

The invention can be better understood with reference to the following drawings and descriptions. The components in the figures are not necessarily to scale, instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
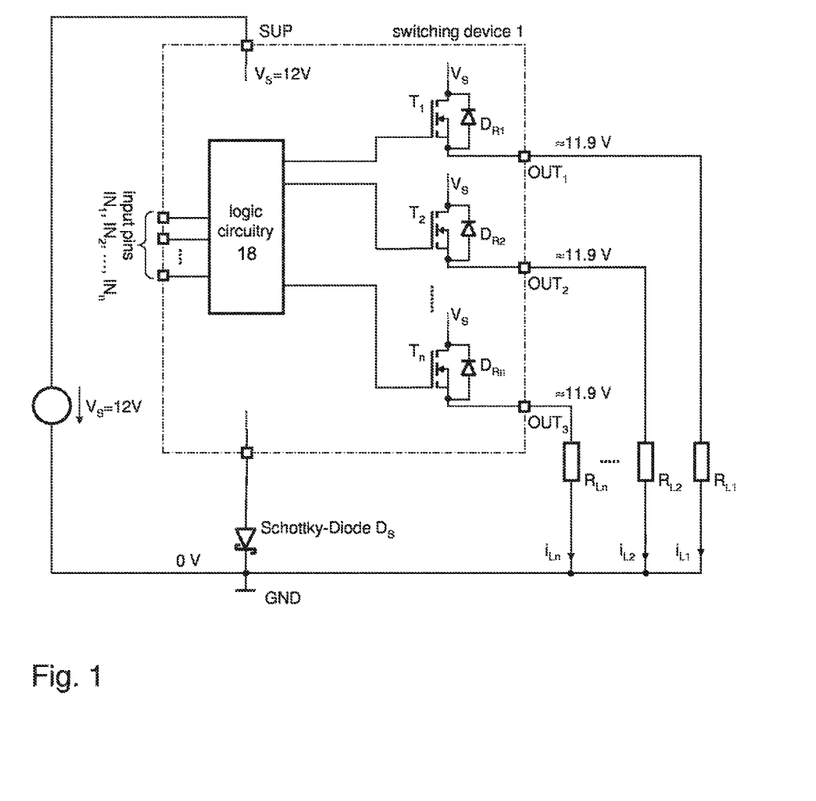
FIG. 1 illustrates an exemplary switching device with multiple output channels, each channel including one high-side n-channel MOS transistor (exemplary voltage levels are specified for normal operation)
Figure 2:
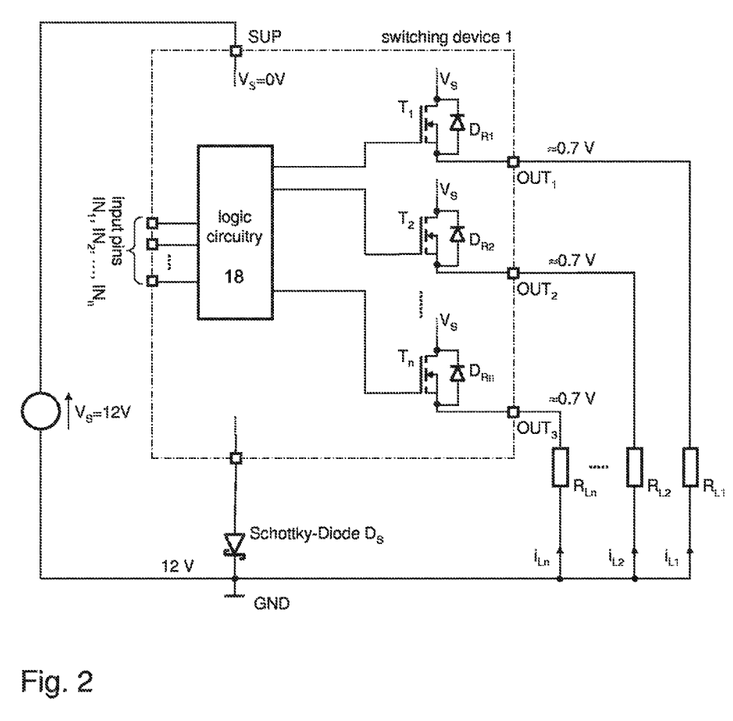
FIG. 2 illustrates the same circuit as FIG. 1 (exemplary voltage levels are specified for reverse polarity operation)

FIG. 1 illustrates an exemplary multi-channel switching device that includes a plurality of output channels. Each channel includes one high-side semiconductor switch. The examples presented herein are related to n-channel MOS transistors that are used as high-side power semiconductor switches. In particular, vertical power MOS transistors (e.g., DMOS transistors with or without a trench-gate) are considered. In FIG. 1 includes labels indicating the voltage levels for different circuit nodes in case of normal operation (positive supply voltage $V_S$=12 V, ground potential $V_{GND}$=0 V). FIG. 2 illustrates the same circuit. However, the labels included in FIG. 2 labels indicate the voltage levels for different circuit nodes in case of reverse polarity operation (supply voltage $V_S$=0 V, ground potential $V_{GND}$=12V).

The exemplary circuit of FIGS. 1 and 2 include a switching device 1 that is supplied with a supply voltage $V_S$ at a supply terminal and a corresponding reference potential, further referred to as ground GND, at a ground terminal. The supply voltage may be, for example, provided by an automotive battery. The switching device includes a plurality of n-channel high-side DMOS transistors $T_1, T_2, \ldots T_n$ wherein each one of the transistors associated with a respective output channel. Each transistor $T_1, T_2, \ldots, T_n$ has a load current path (e.g., the drain-source current path in case of a MOS transistor) that (internally) couples a respective output terminal $OUT_1, OUT_2, \ldots, OUT_n$ to the supply terminal (potential $V_S$). That is, dependent on the switching state (on or off) of a transistor $T_1, T_2, \ldots, T_n$ a low-resistance current path is provided (via the transistor's load path) from the supply terminal to the output terminal $OUT_1, OUT_2, \ldots, OUT_n$ associated with an output channel. Electric loads may be connected between the output terminals $OUT_1, OUT_2, \ldots, OUT_n$ and ground. The switching state of a transistor $T_1, T_2, \ldots, T_n$ is set in accordance with a respective control signal (e.g., a gate current or a gate voltage in case of a MOSFET) which is provided, for example, using a gate driver circuit (not shown), wherein a gate driver circuit generates the control signals in accordance with input signals supplied to respective input pins $IN_1, IN_2, \ldots IN_n$. One input signal may be provided for each output channel. A logic circuitry 18 may be employed for pre-processing the signals supplied to the input pins $IN_1, IN_2, \ldots IN_n$. Typically the logic circuitry generates the control signals supplied to the gate drivers dependent on the signals supplied to the input pins $IN_1, IN_2, \ldots IN_n$.

Each transistor $T_1, T_2, \ldots, T_n$ has a reverse diode connected parallel to the transistor's load current path. Usual MOS transistors have an intrinsic reverse diode which always exists due to the internal set-up of the transistor. Other transistors, which do not have an intrinsic reverse diode, may have an external reverse diode to allow free-wheeling when switching inductive loads.

In order to provide a reverse polarity protection of the internal circuitry of the switching device 1 it is known to connect a diode, e.g., a Schottky diode, between the ground terminal of the switching device and the actual ground potential provide by the power supply (e.g., the automotive battery). However, this diode can be replaced by a more sophisticated circuit as will be described later (see also FIG. 9).

The labels indicating the voltage levels present at various circuit nodes refer to voltage levels during normal operation in FIG. 1 and to voltage levels during reverse polarity operation in FIG. 2. During normal operation the ground terminal has a voltage level of 0 V, whereas the supply terminal has a positive voltage level of, e.g., $V_S$=12 V in case of an automotive battery. When an output transistor $T_1, T_2, \ldots, T_n$ is active, the on resistance is low and the voltage drop across the transistor's load path comparably (as compared to the supply voltage) low. In the present example a voltage drop of 100 mV across the output transistors $T_1, T_2, \ldots, T_n$ is assumed so that the voltage at the output terminals $OUT_1, OUT_2, \ldots, OUT_n$ is 11.9 V.

During reverse polarity operation (see FIG. 2) the supply voltage of 12 V is applied reversely to the switching device 1. That is, the ground terminal is at 12 V and the supply terminal is at a voltage level of 0 V. As a consequence the reverse diodes $D_{R1}, D_{R2}, \ldots, D_{Rn}$ become forward bias and thus conductive. The voltage drop across each diode is typically at least 0.7 V (as compared to 0.1 V in the prior case of normal operation) and thus the power losses are at least a factor seven higher than in the case of normal operation. It goes without saying that those high power losses may lead to a thermal destruction of the switching device 1. As a consequence, reverse polarity protection circuitry is required, one example of which is described below with reference to FIGS. 3 and 4.

Figure 3:
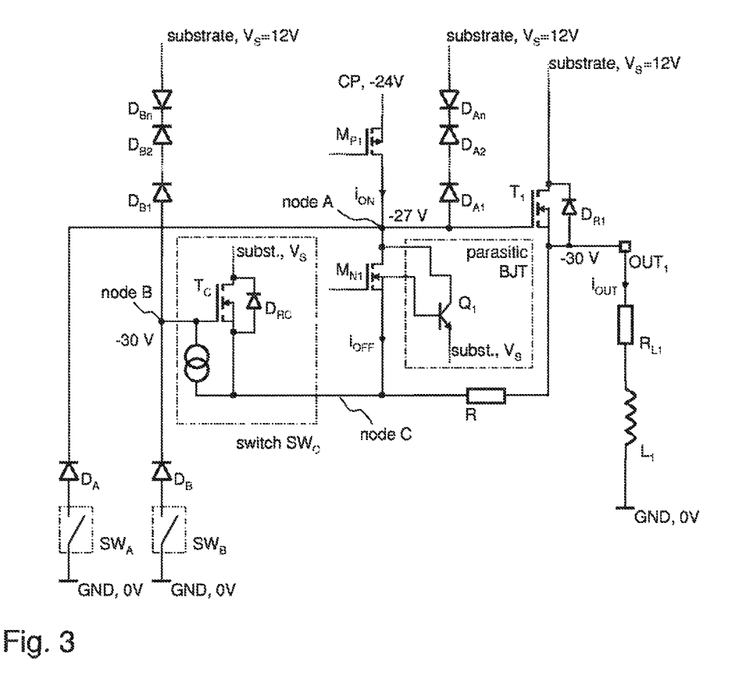
FIG. 3 illustrates a switching device including one exemplary high-side n-channel MOS transistor and a reverse polarity protection circuit in accordance with one example of the invention (exemplary voltage levels are specified for normal operation during active clamping)

FIG. 3 illustrates one of the power semiconductor switches included in the switching device 1 shown in FIG. 1. In the present example the power semiconductor switch is implemented as high-side n-channel DMOS transistor $T_1$, which has an intrinsic reverse diode $D_{R1}$ coupled parallel to the drain-source current path of the transistor $T_1$. As the power transistor $T_1$ is a high-side switch, the supply terminal that receives the supply voltage $V_S$ is connected to the drain electrode of the transistor $T_1$. The source electrode of the transistor $T_1$ is connected to the output terminal $OUT_1$ of the respective output channel.

As the power transistor is a vertical n-channel MOS transistor, the supply terminal (and thus also the drain electrode of the power transistor) is electrically connected to the semiconductor substrate in which the power transistor is integrated. Therefore, the substrate has an electric potential $V_S$ equal to the potential that is supplied to the respective supply terminal (e.g., 12 V during normal operation, 0V during reverse polarity operation).

The transistors $M_{P1}$ and $M_{N1}$ form a CMOS half-bridge (e.g., CMOS inverter) and can be regarded as part of the gate driver circuit GD (i.e., as gate driver output stage). The p-channel MOS transistor $M_{P1}$ is connected between a floating supply voltage terminal CP, at which a floating supply voltage is applied with respect to the source electrode of the power transistor $T_1$, and the gate electrode of the power transistor $T_1$. The n-channel MOS transistor $M_{N1}$ is connected between the gate electrode and (e.g., via a resistor R) the source electrode of the power transistor $T_1$. The floating supply voltage may be provided by a bootstrap supply circuit or any other kind of charge pump. Floating power supplies for gate driver circuits are known as such and therefore not further discussed here. In other words, the CMOS half-bridge formed by the transistors $M_{P1}$ and $M_{N1}$ is connected between the floating supply voltage terminal CP and a circuit node C which is electrically connected (via the resistor R) to the source electrode of the power transistor $T_1$. The source potential of the power transistor $T_1$ provides the floating reference potential for the floating supply voltage. The inverter output is connected to the gate of the power transistor $T_1$. The resistor R is implemented to provide an ESD protection for protecting the device against electrostatic discharges (short: ESD). Furthermore, the resistor R decouples the source electrode of the power transistor $T_1$ from the floating p-doped well in which the gate driver circuit GD is integrated. This decoupling can be advantageously used during reverse polarity (see below).

During normal operation (i.e., when the battery or any other power supply is correctly connected to the supply terminal and provides a positive supply voltage $V_S$ of, e.g., 12 V) the power transistor $T_1$ may be activated (switched on) and deactivated (switched off) either by supplying a positive gate current $i_G = i_{ON}$ to the gate electrode of the power transistor $T_1$ (thus charging the gate) or, respectively, by draining a negative gate current $i_G = i_{OFF}$ from the gate electrode (thus discharging the gate). For charging the gate the p-channel MOS transistor $M_{P1}$ is activated (e.g., by means of the logic circuitry 18 shown in FIG. 1) while the n-channel MOS transistor $M_{N1}$ is inactive (switched off). Conversely, for discharging the gate the n-channel MOS transistor $M_{N1}$ is activated (e.g., by means of the logic circuitry 18 shown in FIG. 1) while the p-channel MOS transistor $M_{P1}$ is inactive (switched off). It should be noted, that a more sophisticated gate driver circuit may be implemented, e.g., to provide a gate current profile to achieve a specific switching characteristic of the power transistor $T_1$.

As usual, the MOS transistor $M_{N1}$ of the CMOS inverter has a parasitic npn-type bipolar junction transistor (BJT) $Q_1$ coupled in parallel, wherein the n-doped collector of the BJT $Q_1$ is formed by the drain of the MOS transistor $M_{N1}$, the base of the BJT $Q_1$ is formed by the p-doped body (bulk) of the MOS transistor $M_{N1}$, and the n-doped emitter of the of the BJT $Q_1$ is formed by the n-doped substrate, that is connected to the supply voltage $V_S$ as discussed above. The implementation of the integrated power transistor $T_1$ and the CMOS gate formed by transistors $M_{N1}$, $M_{P1}$ is sketched in FIG. 5 which is a cross-sectional view through (a part of) the semiconductor body in which the switching device 1 is integrated.

Figure 4:
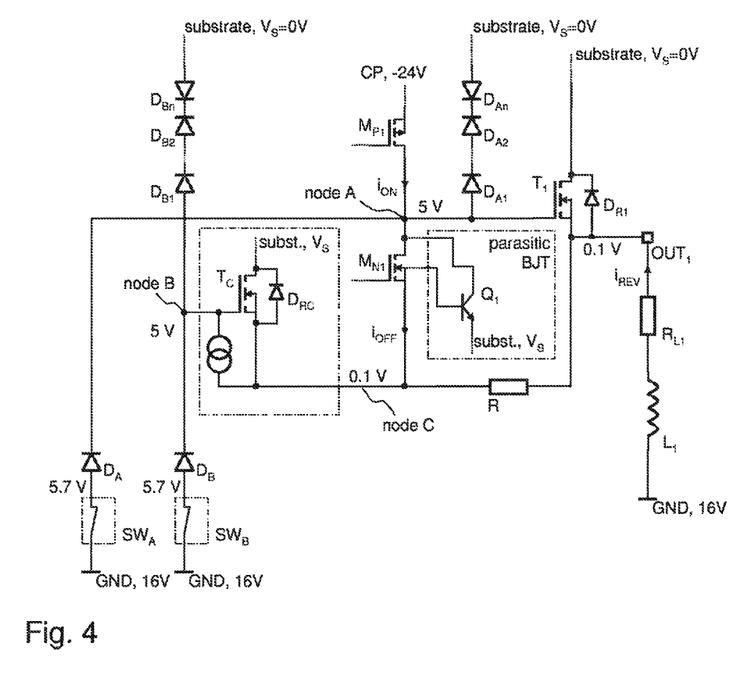
FIG. 4 illustrates the same circuit as FIG. 3 (exemplary voltage levels are specified for reverse polarity operation)

FIGS. 3 and 4 further illustrate circuit components which form a reverse polarity protection circuit for protecting the power transistors $T_1$ from the negative effects of reverse polarity as discussed above. A series circuit of an electronic switch $SW_A$ and a diode $D_A$ may be connected between the ground terminal GND (ground potential $V_{GND}$) and a circuit node A that is also connected to the gate electrode of the power transistor $T_1$ and the drain electrode of the MOS transistor $M_{N1}$. The electronic switch $SW_A$ is open during normal operation and closed during reverse polarity operation. When closed the electronic switch $SW_A$ provides a current path of a defined resistance $R_A$. One exemplary implementation of the switch $SW_A$ is discussed later with respect to FIG. 6.

The cathode of the diode $D_A$ is coupled with circuit node A whereas the anode of the diode is coupled to ground potential (via the electronic switch $SW_A$). Thus, the diode $D_A$ is forward biased during reverse polarity operation as, in this case, the ground terminal is supplied with a high positive supply voltage (e.g., 16 V) while the supply terminal has an electric potential of $V_S=0V$, and the source potential of the power transistor $T_1$ is thus limited to 0.7 V due to the forward biased reverse diode $D_{R1}$ of the power transistor $T_1$.

For the case of a reversed supply polarity, the series circuit of switch $SW_A$ and diode $D_A$ may pull the gate of the power transistor $T_1$ to voltage levels high enough to activate the power transistor $T_1$. In this case the power transistor $T_1$ provides a low resistance current path (drain-source current path) that by-passes the reverse diode $D_{R1}$. As a consequence the voltage drop across the power transistor $T_1$ is about −100 mV (or even lower) whereas the voltage drop (drain-source voltage) would be at least −700 mV if the power transistor $T_1$ were not activated.

The above-mentioned parasitic BJT $Q_1$ may, however, inhibit the activation of the power transistor $T_1$ in case of a reversed supply polarity. During reverse polarity operation an activation (i.e., a forward-biasing of the base-emitter diode) of the BJT may occur and, as a result, the BJT $Q_1$ would become conductive and thus clamp the potential at circuit node A, which is supplied to the gate of the power transistor $T_1$, to about 0 V (i.e., the substrate potential $V_S$ during reverse polarity). This clamping of the gate potential to about 0V would inhibit the activation of the power transistor $T_1$ and make the above-described series circuit of diode $D_A$ and switch $SW_A$ ineffective. So additionally to that series circuit of switch $SW_A$ and diode $D_A$ for activating the power transistor $T_1$ during reverse polarity operation, further circuit components are required that are able to prevent an activation of the parasitic BJT $Q_1$. For this purpose another electronic switch $SW_C$ is used, which is configured to short-circuit the base-emitter diode of the parasitic BJT $Q_1$ and thus to inhibit an activation of the BJT. However, the electronic switch $SW_C$ should not be active during normal operation but rather during reverse polarity operation only. Other circuitry than the switch $SW_C$ may also appropriate to inhibit the activation of the BJT $Q_1$. As such, the illustrated circuit has to be regarded as an example.

In the example presented in FIGS. 3 and 4 the electronic switch $SW_C$ is formed by one or more DMOS transistor cells (forming the DMOS transistor $T_C$). The drain electrodes of the transistor $T_C$ and the power transistor $T_1$ are both connected to the supply terminal. This comes naturally when both transistors $T_C$, $T_1$ are integrated in the same manner in the same substrate. To activate (switch on) the transistor $T_C$ (and thus the switch $SW_C$) another series circuit of a switch $SW_B$ and a diode $D_B$ is employed. The series circuit $SW_B$, $D_B$ is connected between a circuit node B and the ground terminal GND. The circuit node B is connected to the gate electrode of the transistor $T_C$. During normal operation the switch $SW_B$ is open whereas the switch $SW_B$ is closed during reverse polarity operation. When closed the electronic switch $SW_B$ provides a current path of a defined resistance $R_B$. One exemplary implementation of the switch $SW_B$ is discussed later with respect to FIG. 6. While the switch $SW_B$ is open (i.e., during normal operation) the transistor $T_C$ is switched off, e.g., using the current source $X_S$. The current source $X_S$ is coupled between the gate and the source electrode of the transistor $T_C$ such that, during normal operation, the gate-source capacitance of the transistor TC is discharged and the transistor $T_C$ (and thus the switch $SW_C$) is inactive (switched off).

The function of the circuit of FIGS. 3 and 4 is summarized below and with reference to the exemplary voltage levels given in FIGS. 3 and 4 for normal operation and for a reversed supply polarity, respectively. The voltage levels included in the labels in FIG. 3 represent a state in which the voltage across the inductive load is clamped to a minimum of, e.g., −30 V. A negative voltage can be observed at the output terminal $OUT_1$ when the inductive load (represented by the inductor $L_1$ and the series resistance $R_{L1}$) is switched off. To limit the negative output voltage in magnitude, the gate of the power transistor $T_1$ (circuit node A) is coupled to the supply terminal via a series circuit of several diodes $D_{A1}$, $D_{A2}$, . . . $D_{An}$ (two, e.g., zener, diodes coupled back-to-back may be sufficient, however) that limits the drain-gate voltage to a maximum, which is 39 V (12 V drain voltage, −27V minimum gate voltage) in the present example. If the output voltage at the output terminal (and thus at the source electrode of the power transistor $T_1$) falls to 30 V, the gate voltage is clamped to the mentioned 27 V and thus the drain-source voltage is high enough to keep the transistor conductive thus allowing the energy stored in the inductor $L_1$ to dissipate in the power switch $T_1$. During this "discharging" of the inductor $L_1$ the output voltage is also clamped to a minimum of, e.g., −30 V. It should be emphasized, however, that the voltage levels indicated in FIG. 3 are merely an illustrative example. The actual voltage levels depend on the actual implementation of the circuit, particularly on the maximum voltage across the diode "chain" $D_{A1}$, $D_{A2}$, . . . , $D_{An}$.

As mentioned above, the switches $SW_A$, $SW_B$, and $SW_C$ are inactive during normal operation (i.e., while the supply polarity is not reversed). Another diode chain $D_{B1}$, $D_{B2}$, . . . , $D_{Bm}$ may be coupled between the circuit node B and the supply terminal (supply voltage $V_S$) to provide a clamping mechanism to the transistor $T_C$, which forms the switch $SW_C$. The purpose and function of the diode chain $D_{B1}$, $D_{B2}$, . . . , $D_{Bm}$ is the same as the of the diode chain $D_{A1}$, $D_{A2}$, . . . , $D_{An}$.

FIG. 4 illustrates the same circuit as FIG. 3. However, the labels indicating the voltage levels refer to a situation with reversed supply polarity. When the supply polarity is reversed, the supply terminal is at $V_S=0$ V and the ground terminal GND is supplied with the positive supply voltage which is 16 V in the present example. As mentioned above, the switches $SW_A$ and $SW_B$ are switched on during reverse polarity operation. The closed switch $SW_B$ pulls the gate of the transistor $T_C$ (i.e., the circuit node B) to a voltage level that is high enough (e.g., 5V) to activate the transistor $T_C$. That is, the switch $SW_C$ is switched on and thus an activation of the parasitic BJT Q1 is prevented. The output voltage at the output terminal $OUT_1$ is clamped to about 100 mV which is the voltage drop across the switch $SW_C$ and thus the maximum base-emitter voltage provided to the BJT $Q_1$ is about 100 mV which is too low to activate the BJT. As an activation of the BJT $Q_1$ is not possible the closed switch $SW_A$ pulls the voltage at the circuit node A (gate of the power transistor $T_1$) to a level that is high enough (e.g., 5V) to activate the power transistor $T_1$, thus reducing the voltage drop across the power transistor $T_1$ to about 100 mV. It should be emphasized, however, that the voltage levels indicated in FIG. 4 are merely an illustrative example. The actual voltage levels depend on the actual implementation of the circuit, particularly on the on-resistance of the DMOS transistors $T_1$ and $T_C$.

Figure 5:
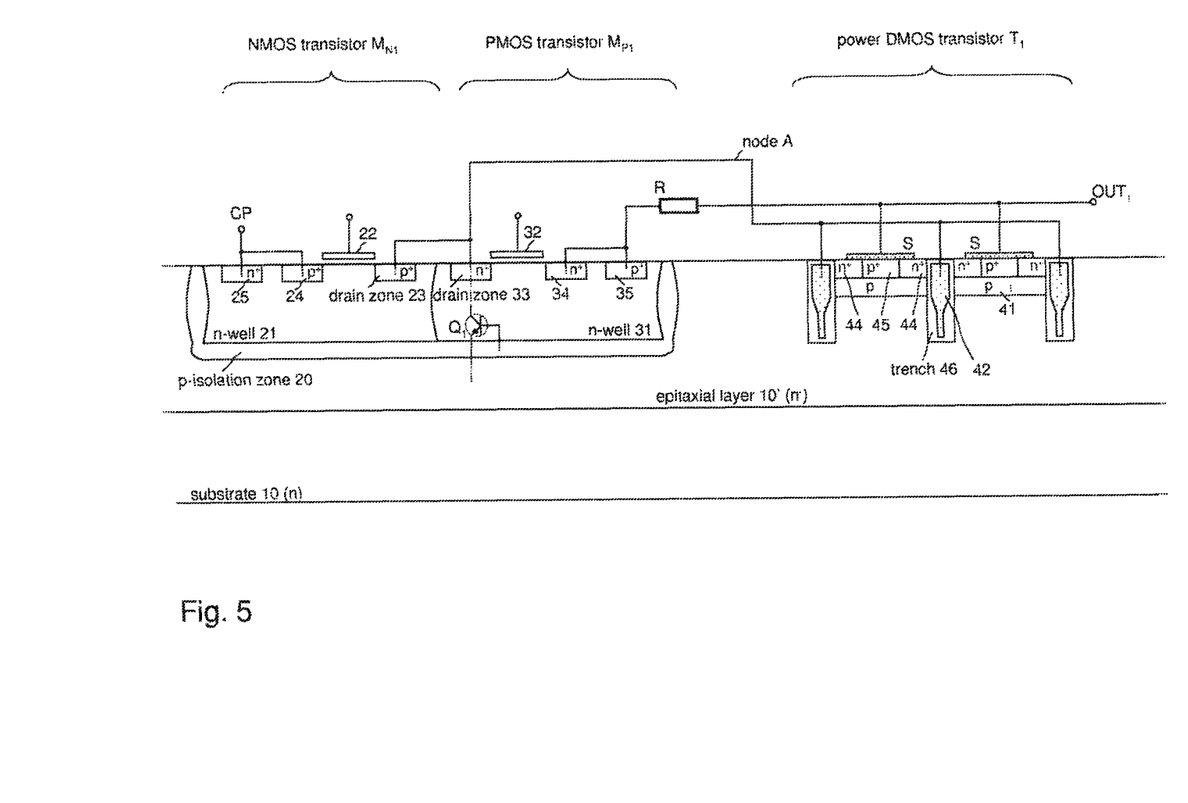
FIG. 5 is a cross sectional view through a semiconductor body in which a DMOS power transistor and a CMOS gate is integrated.

FIG. 5 illustrates the implementation of the power DMOS transistor $T_1$ as well as the CMOS gate $T_{P1}$, $T_{N1}$ in a n-doped substrate. FIG. 5 illustrates a cross-section through the semiconductor body. The cross-section illustrates the power DMOS transistor $T_1$ (at least partly as the transistor $T_1$ is composed of a plurality of transistor cells) in the right side of the illustration and the CMOS half-bridge (transistors $M_{P1}$ and $M_{N1}$, see FIG. 3) on the left side of the illustration. The depicted doped zones are not true to scale. Moreover, only those components, which are relevant for the present discussion, are included in the illustration. Oxide layers, some metallization layers, strip lines, etc. have been omitted to allow to concentrate on the relevant parts. In the present example, an epitaxial layer 10' is disposed (by way of epitaxial deposition) on the silicon substrate 10. The silicon substrate is n-doped, the epitaxial layer 10' is also made of an n-doped silicon, usually with a lower doping concentration (indicated by the superscript in "n⁻"). The resulting semiconductor body including the epitaxial layer is often referred to as substrate. It should be noted, that dependent on the manufacturing technology used, the epitaxial layer is optional. The power MOS transistor $T_1$ is implemented as a vertical trench gate transistor. Generally, a vertical transistor is a transistor, in which the load current (i.e., the drain-source current in the case of a MOSFET) is directed from a top surface (where the source electrode is located) of the semiconductor body in a vertical direction through the semiconductor body to a bottom surface (where the drain electrode is located) of the semiconductor body. Transistor cells are formed (and separated by) trenches 46 extending from the top surface into the epitaxial layer 10' of the semiconductor body. The semiconductor portions between two neighbouring trenches 46 form the transistor cells. In each transistor cell a body zone 41 is formed, e.g., by ion implantation, or diffusion of dopants. In the present example, the body zones 41 are p-doped and extend from the parallel to the top surface of the semiconductor body. Heavily n-doped source zones 44 and heavily p-doped body contact zones 45 are formed (e.g., by way of ion implantation and/or diffusion). The source zones 44 and the body contact zones 45 are extend from the top surface of the semiconductor body into the epitaxial layer 10' such that they are (in a vertical direction) "enclosed" between the body zones 41 and the top surface of the semiconductor body. In a horizontal direction the source zones 44 are confined by the trenches 46 and the body contact zones 45.

Gate electrodes 42 are formed within the trenches 46 adjacent to the source zones 44 and the body zones 41. Thus, an conductive n-type channel can be established from the source zones 55 through the corresponding body zones 41 to the epitaxial layer 10' (also referred to as drift zones). The drain of the power transistor cells is formed by the substrate 10. Source electrodes S (usually made of metal) are formed to contact the source zones 44 and the body contact zones 45. The source electrodes S are electrically connected to the output circuit node $OUT_1$ (see also FIG. 3). The gate electrodes 42 are electrically connected to circuit node A (see also FIG. 3).

On the left side of the illustration of FIG. 5 one can see the implementation of the CMOS half-bridge (transistors $M_{P1}$ and $M_{N1}$, see also FIG. 3). The NMOS transistor $M_{N1}$ is integrated in a p-doped well 31 (short: p-well), whereas the PMOS transistor $M_{P1}$ is integrated in an n-doped well 21 (short: n-well). Both, the n-well 21 and the p-well 31 are formed in the epitaxial layer by way of ion implantation and/or diffusion of dopants, and both are adjacent to each other and separated from the (remaining) epitaxial layer by a p-doped isolation zone 20 (short: p-iso zone), which is a so-called junction isolation zone wherein the isolation is provided by a reverse biased pn-junction between the p-iso zone 20 and the n-doped substrate 10. That is, the n-well 21 and the p-well 31 are enclosed by the p-iso zone 20 and the top surface of the semiconductor body. Within each well 21 and 31 a source zone 24, 34, a corresponding drain zone 23, 33, and a corresponding body contact zone 25, 35 is formed, e.g., by way of ion implantation and/or diffusion of dopants.

The NMOS transistor $T_{N1}$ is formed within the p-well 31 (also forming the transistor's body zone) by the source zone 34 (n-doped), the drain zone 33 (n-doped), and the gate electrode 32 arranged parallel to the surface of the semiconductor body between the source zone 34 and the drain zone 33. The PMOS transistor $T_{P1}$ is formed within the n-well 21 (also forming the transistor's body zone) by the source zone 24 (p-doped), the drain zone 23 (p-doped), and the gate electrode 22 arranged parallel to the surface of the semiconductor body between the source zone 24 and the drain zone 23. The body contact zones 25 and 35 are of the same conduction type (p or n) as the respective well 21 and 31, respectively. The drain zones 23 and 33 are electrically connected to circuit node A and thus to the gate electrodes 42 of the power MOSFET $T_1$ (see also FIG. 3). The source zone 34 and the body contact zone 35 are short-circuited and both electrically connected to the source electrode S of the power MOSFET $T_1$ via the resistor R (see also FIG. 3). The source zone 24 and the body contact zone 25 are short-circuited and both electrically connected to the floating supply terminal CP (e.g., coupled to a charge pump) as already described with reference to FIGS. 3 and 4.

The parasitic bipolar junction transistor (BJT) $Q_1$ discussed above with reference to FIGS. 3 and 4 is also sketched in FIG. 5. One can see in FIG. 5 that the emitter of the BJT $Q_1$ is formed by the n-doped epitaxial layer 10', its collector is formed by the n-doped drain zone 33 (of NMOS transistor $M_{N1}$), and its base is formed by the p-doped well 31 and the isolation zone 20. As already explained with reference to FIG. 3, the BJT $Q_1$ can electrically connect—when active—the trench gates 42 (i.e., circuit node A) with the substrate 10 and thus with its electrical potential.

Figure 6:
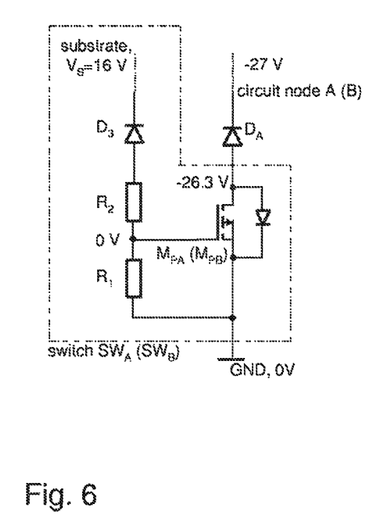
FIG. 6 illustrates one detail of the circuit of FIG. 3 including a p-channel MOS transistor (exemplary voltage levels are specified for normal operation)
Figure 7:
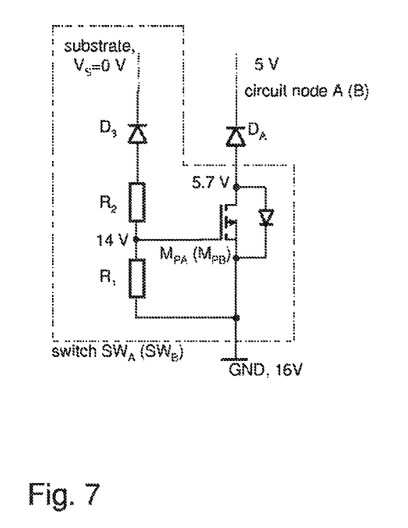
FIG. 7 illustrates the same detail as FIG. 5 (exemplary voltage levels are specified for reverse polarity operation)

FIGS. 6 and 7 illustrate one exemplary implementation of the switch $SW_A$ used in the circuit of FIG. 3. The switch $SW_B$ may be implemented in an identical manner. In accordance with the present example, the switch $SW_A$ is implemented as a p-channel MOS transistor $M_{PA}$. The source of the transistor $M_{PA}$ is coupled to the ground terminal GND whereas the drain terminal of the transistor $M_{PA}$ is coupled to the circuit node A (via the diode $D_A$). The diode $D_A$ blocks any current flowing through the intrinsic reverse diode of the transistor $M_{PA}$, when the transistor $M_{PA}$ is blocking during normal operation. The gate of the a p-channel MOS transistor $M_{PA}$ is coupled to the ground terminal GND via a resistor $R_1$ and also to the supply terminal (potential $V_S$) via a series circuit of a further diode $D_3$ and a resistor $R_2$. The cathode of the diode $D_3$ is coupled to the supply terminal. Thus the resistors $R_1$ and $R_2$ form a voltage divider with a middle tap connected to the gate of the transistor $M_{PA}$.

As during normal operation (see FIG. 6) the ground terminal is at 0 V and the supply terminal at a positive supply voltage (e.g., 16 V in the present example) the diode $D_3$ is reverse biased. Thus, the supply voltage drops across the diode $D_3$ whereas the voltage at the middle tap of the voltage divider is at 0 V. As a consequence, the transistor $M_{PA}$ is inactive during normal operation, as the gate-source-voltage is zero. In the present example (and in accordance with the example of FIG. 3) the voltage at the circuit node A is assumed to be −27 V and the voltage drop across the diode $D_A$ about 0.7 V, and thus the diode $D_A$ has to block about −26.3 V.

During reverse polarity operation (see FIG. 7) the ground terminal is supplied with the positive supply voltage, e.g., 16 V whereas the supply terminal is at 0 V. The diode $D_3$ is forward biased and the middle tap of the voltage divider $R_1$, $R_2$ is pulled up to a voltage low enough (e.g., 14 V) to activate the transistor $M_{PA}$. In the present example (and in accordance with the example of FIG. 4) the voltage at the circuit node A is assumed to be 5 V and the voltage drop across the diode $D_A$ about 0.7 V, and thus the voltage drop across the switch $SW_A$ is about 10 V (drain voltage 16 V, source voltage 5.7 V).

Figure 8:
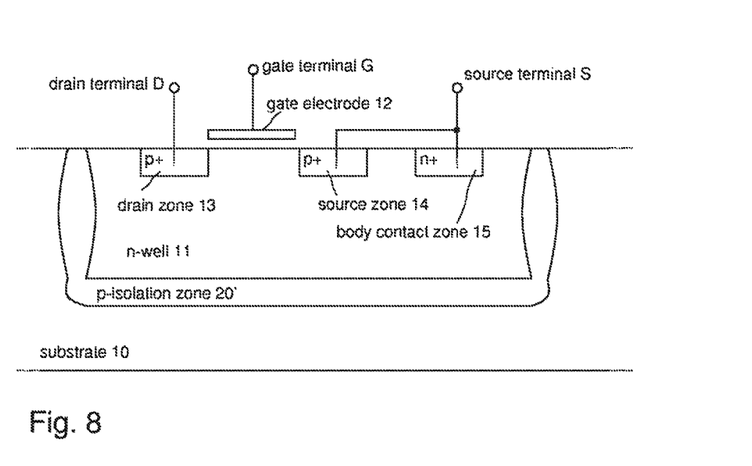
FIG. 8 illustrates the implementation of the p-channel MOS transistor used in the example of FIG. 5 by means of a cross-sectional view of a semiconductor body, the n-doped body zone of the transistor being isolated from the n-doped substrate by a p-doped isolation zone.

FIG. 8 illustrates one exemplary implementation of the p-channel MOS transistor $M_{AP}$ by means of a cross sectional view of the semiconductor body. Accordingly, the MOS transistor $M_{AP}$ may be implemented similar to the transistor $M_{P1}$ of the CMOS gate mentioned above with regard to FIG. 5. However, the PMOS transistor $M_{AP}$ has to be designed to withstand higher blocking voltages. Accordingly, the PMOS transistor $M_{AP}$ is formed in an n-doped well 11 (short: n-well), which is isolated from the surrounding semiconductor body (or epitaxial layer 10') by an p-doped isolation zone 20' similar to the PMOS transistor $M_{P1}$ illustrated in FIG. 5. A p-doped source zone 14 and a p-doped drain zone 13 as well as an n-doped body contact zone 15 are formed in the n-well 11 by way of ion implantation and/or diffusion of dopants. A gate electrode 12 is arranged parallel to the top surface of the semiconductor body between the source and the drain zone 14, 13. The source zone 14 and the body contact zone 15 are electrically short circuited. In order to avoid an activation of any parasitic bipolar transistor, the electrical potential of the p-isolation zone 20' should be maintained at or close to 0 V regardless of the operation mode (normal operation or reverse polarity) of the circuit. This task may achieved by the circuit depicted in FIG. 9.

Besides the purpose described above (maintaining the potential of the p-isolation zone 20' of the transistors $M_{PA}$ and $M_{PB}$ at or close to 0 V, see FIGS. 6 to 8) the circuit of FIG. 9 can also replace the Schottky diode $D_S$ depicted in FIG. 1. The circuit of FIG. 9 is connected between the ground terminal GND of the smart switch device 1 and the supply terminal SUP (i.e., the substrate 10), which is provided with the supply potential $V_S$. Two MOS transistors $M_{HV1}$, $M_{HV2}$ are connected in series between ground potential $V_{GND}$ present at the ground terminal GND and the supply potential VS present at the substrate (see substrate 10 in FIG. 5). Both transistors $M_{HV1}$, $M_{HV2}$ are n-channel MOS transistors having a high blocking voltage. The common circuit node between the two MOS transistors is denoted as internal ground node $GND_{INT}$ to which the p-isolation zones 20' (see FIG. 8) are electrically connected. The source electrodes of both transistors are electrically connected to the internal ground node $GND_{INT}$ whereas the drain electrode of transistor $M_{HV1}$ is electrically connected to the substrate (and thus to the supply voltage $V_S$) and the drain electrode of the transistor $M_{HV2}$ is electrically connected to the ground terminal GND. It should be noted that the transistor $M_{HV1}$ as well as the zener diode $D_Z$ coupled between the gate of the transistor $M_{HV1}$ are used to provide an over-voltage protection and are thus optional for the purpose of reverse polarity protection.

Figure 9A:
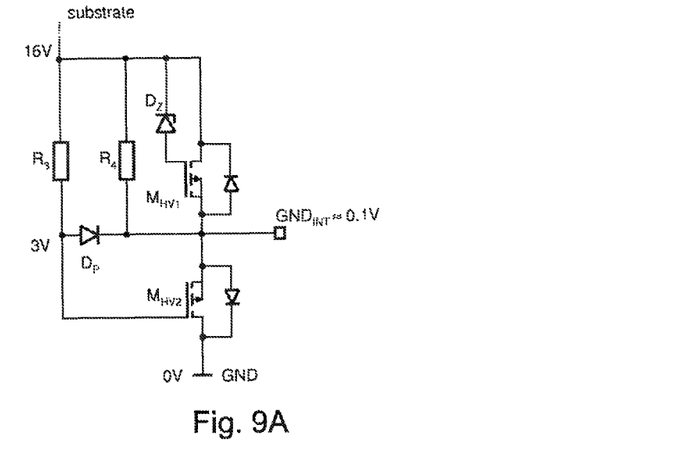
FIGS. 9a and 9b, collectively FIG. 9, include a circuit configured to apply a specific potential to the p-doped isolation zone of the transistor of FIG. 8.

FIG. 9a illustrates exemplary voltages during normal operation ($V_S$=16V, $V_{GND}$=0V). In this mode of operation, the MOS transistor $M_{HV2}$ is activated as its gate is charged via the resistor $R_3$ that is connected between the substrate and the gate terminal of the MOS transistor $M_{HV2}$. That is, the supply potential $V_S$ is coupled to the gate of the MOS transistor $M_{HV2}$ via the resistor $R_3$. As a result, the circuit node $GND_{INT}$ is almost short-circuited to the (external) ground terminal GND via the MOS transistor $M_{HV2}$ and the potential at the circuit node $GND_{INT}$ is approximately 0.1 Volts. The gate voltage of the MOS transistor $M_{HV2}$ is limited (in the present example to 3 V) by the diode $D_P$, which is coupled between the circuit node $GND_{INT}$ and the gate electrode of the MOS transistor $M_{HV2}$. In the present example, the diode $D_P$ is a MOS diode which has a forward voltage of about 3 V. A series circuit of several PN-diodes or a reverse biased zener diode may, however, also be used. The labels included in FIG. 9a illustrate voltage labels in the case of a normal operation ($V_S$=16V, $V_{GND}$=0V).

Figure 9B:
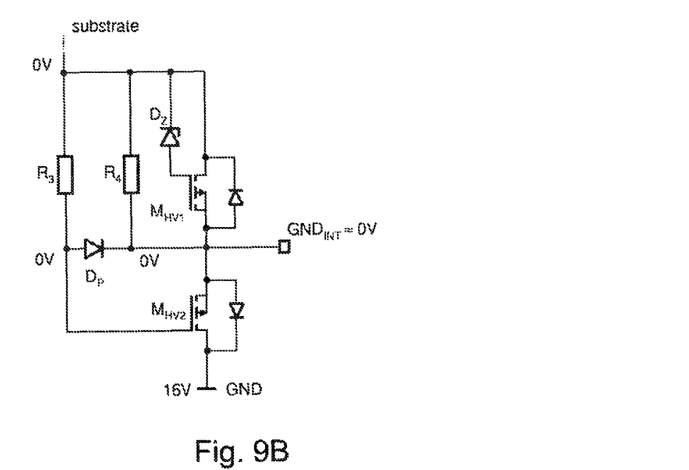

FIG. 9b illustrates exemplary voltages during reverse polarity ($V_S$=0V, $V_{GND}$=16V). In this mode of operation, the MOS transistor $M_{HV2}$ is switched off as the gate is pulled down to 0V via the resistor $R_3$. Further the potential present at the circuit node $GND_{INT}$ is also pulled down by the resistor $R_4$ which is coupled between the substrate ($V_S$=0V in case of reverse polarity) and the circuit node $GND_{INT}$.

Generally, the circuit of FIG. 9 provides an electric potential of approximately 0V to the p-isolation zone(s) 20' and thus an activation of a parasitic bipolar resistor is avoided regardless of whether the smart switch is operated with normal supply voltage or with reversed supply voltage.

Although exemplary embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

What is claimed is:

1. A semiconductor device comprising:
a semiconductor chip including a substrate;
a first supply terminal electrically coupled to the substrate to provide a first supply potential and a load current to the substrate;
a second supply terminal operably provided with a second supply potential;
a first vertical transistor integrated in the semiconductor chip and electrically coupled between the first supply terminal and an output terminal, the first vertical transistor configured to provide a current path for the load current to the output terminal in accordance with a control signal that is provided to a gate electrode of the first vertical transistor;
a control circuitry integrated in the semiconductor chip and coupled to the first vertical transistor and configured to generate the control signal to switch the first vertical transistor on and off, the control circuitry including a reverse polarity protection circuit that comprises:
a first MOS transistor coupled in series with a first diode, the first MOS transistor and the first diode being coupled between the first and the second supply terminals; and
a first switching circuit coupled to the first MOS transistor and electrically connected between the first and the second supply terminals, the first switching circuit configured to activate the first MOS transistor when the second supply potential exceeds the first supply potential by more than a given threshold, wherein
the control circuitry further comprises a gate driver output stage including an n-channel MOS transistor coupled between the gate electrode of the first vertical transistor and a first circuit node that is electrically connected to the output terminal via a resistor, and
the reverse polarity protection circuit further comprises a second vertical transistor integrated in the semiconductor chip and electrically coupled between the first supply terminal and the first circuit node, the second vertical transistor configured to establish, when activated, a current path between the first supply terminal and the first circuit node.

2. The semiconductor device of claim 1, wherein the first vertical transistor is an n-channel high side transistor and the substrate is an n-doped substrate.

3. The semiconductor device of claim 1,
wherein the reverse polarity protection circuit further comprises:
a second MOS transistor coupled in series with a second diode, the second MOS transistor and the second diode being coupled between the first and the second supply terminals; and
a second switching circuit that is coupled to the second MOS transistor, and is electrically connected between the first and the second supply terminals, the second switching circuit configured to activate the second MOS transistor when the second supply potential exceeds the first supply potential by more than the given threshold.

4. The semiconductor device of claim 3, wherein the first diode is coupled to the gate electrode of the first vertical transistor, and wherein the second diode is coupled to the gate electrode of the second vertical transistor.

5. The semiconductor device of claim 3, wherein the n-channel MOS transistor included in the driver output stage is integrated in a p-doped well arranged in the substrate, the substrate being n-doped.

6. The semiconductor device of claim 3,
wherein the first vertical transistor is an n-channel high side transistor and the substrate is an n-doped substrate composed of a plurality of transistor cells, and
wherein the second vertical transistor is an n-channel transistor composed of one or more transistor cells, the second vertical transistor having fewer transistor cells than the first vertical transistor.

7. The semiconductor device of claim 6,
wherein the substrate is an n-doped silicon substrate including an n-doped well that extends into the substrate from a top surface of the substrate and that is enclosed by a p-doped isolation zone so that the p-doped isolation zone and the n-doped substrate form a junction isolation isolating the n-doped well from the substrate; and
wherein the first MOS transistor and/or the second MOS transistor is a p-channel MOS transistor that is integrated in the n-doped well.

8. The semiconductor device of claim 6,
wherein the driver output stage further includes a p-channel MOS transistor coupled in series to the n-channel MOS transistor thus forming a CMOS half-bridge;
wherein the p-channel MOS transistor is coupled between the gate electrode of the first vertical transistor and a floating supply terminal;
wherein the p-channel MOS transistor included in the driver output stage is integrated in an n-doped well arranged in the substrate; and
wherein the n-doped well is isolated from the substrate by a p-doped isolation zone that forms a junction isolation.

9. The semiconductor device of claim 8, further comprising a circuit coupled between the first supply terminal and the second supply terminal and configured to provide an electric potential to the p-doped isolation zone that is at least approximately equal to ground potential regardless of whether the first supply potential is higher than the second supply potential or vice versa.

10. The semiconductor device of claim 8, further comprising
a further transistor coupled between the second supply terminal and an internal ground node this is electrically connected to the p-doped isolation zone so that the p-doped isolation zone and the internal ground node have substantially the same electric potential;
a further switching circuit coupled to the further transistor and to the first supply terminal and configured to activate the further transistor when the first supply potential exceeds the second supply potential, thus electrically connecting the internal ground node with the second supply terminal; and
a further circuit coupled between the first supply terminal and the internal ground node and configured to pull the electric potential of the internal ground node towards the potential present at the first supply terminal when the second supply potential exceeds the first supply potential.

11. The semiconductor device of claim 10,
wherein the further transistor includes an intrinsic reverse diode, which is coupled parallel to a load current path of the further transistor, and
wherein the further switching circuit includes a further resistor coupled between a gate electrode of the further transistor and the first supply terminal, such that a current conduction is possible, when the second supply potential exceeds the first supply potential, neither through the further transistor nor through the intrinsic reverse diode.

12. The semiconductor device of claim 10, wherein the further circuit is a pull-down resistor.

13. The semiconductor device of claim 6, wherein the first diode is coupled to the gate electrode of the first vertical transistor, and wherein the second diode is coupled to the gate electrode of the second vertical transistor.

14. The semiconductor device of claim 6, wherein the n-channel MOS transistor included in the driver output stage is integrated in a p-doped well arranged in the substrate, the substrate being n-doped.

* * * * *